United States Patent [19]

Kowshik

[11] Patent Number: 5,774,406
[45] Date of Patent: Jun. 30, 1998

[54] SWITCHING CIRCUIT FOR CONTROLLED TRANSITION BETWEEN HIGH PROGRAM AND ERASE VOLTAGES AND A POWER SUPPLY VOLTAGE FOR MEMORY CELLS

[75] Inventor: Vikram Kowshik, Fremont, Calif.

[73] Assignee: Programmable Microelectronic Corporation, San Jose, Calif.

[21] Appl. No.: 722,429

[22] Filed: Oct. 3, 1996

[51] Int. Cl.⁶ .................................................. G11C 7/02
[52] U.S. Cl. .............. 365/226; 365/185.24; 365/185.18; 365/185.26; 365/189.09
[58] Field of Search .................. 365/189.01, 189.09, 365/226, 230.01, 185.24, 185.18, 185.26

[56] References Cited

U.S. PATENT DOCUMENTS 5,495,453  2/1996  Wociechowski et al. ......... 365/185.18
5,511,022  4/1996  Yim et al. ........................ 365/185.17
5,579,274  11/1996  Van Buskirk et al. ............... 365/208

Primary Examiner—Viet Q. Nguyen
Attorney, Agent, or Firm—Skjerven, Morrill, MacPherson, Franklin & Friel LLP

[57] ABSTRACT

A switching circuit is disclosed herein which prevents an unwanted forward biasing of P/N junctions therein while allowing voltages exceeding the supply voltage to be provided in a precise manner to such floating gate memory cells. In accordance with the present invention, a switching circuit includes a first stage which effectively isolates programming voltages from supply voltages during programming and erasing operations, thereby allowing program and erase voltages exceeding supply voltage to be provided to an associated memory array. The switching circuit includes a second stage which prevents the unwanted forward-biasing of P/N junctions within the switch and its associated memory array by controlling the discharge rate of internal node when transitioning from either a programming or erasing operation to a read operation.

15 Claims, 4 Drawing Sheets

SWITCHING CIRCUIT FOR CONTROLLED TRANSITION BETWEEN HIGH PROGRAM AND ERASE VOLTAGES AND A POWER SUPPLY VOLTAGE FOR MEMORY CELLS

BACKGROUND

1. Field of the Invention

This invention relates to a switching circuit for providing programming, read, and erase voltages to a programmable memory array.

2. Description of Related Art

It is advantageous in the design of electronic computers to provide permanent or at least semi-permanent electronic storage cells whose binary states may be quickly and easily modified. Many of such storage cells employ a floating gate transistor, where binary states are represented by the presence or absence of charge stored on the floating gate. The programming and erasing of such floating gate memory cells typically requires the application of respective programming and erasing voltages which are substantially greater in magnitude than voltages applied to the cells during normal read operations.

Referring to FIG. 1, a typical memory system 10 includes an oscillator 100, a high-voltage charge pump circuit 200, a voltage regulator 300, and an associated memory array 400 including appropriate decoding circuitry for controlling which of the memory elements therein are selected for various read, program, and erase operations. The voltages used to read, program, and erase memory cells (not shown) within memory array 400 are provided thereto via a program line $V_{pp}$. During programming and erasing operations, charge pump 200 generates, in response to a clocking signal provided thereto by oscillator 100, a high voltage on line $V_{pp}$ which is regulated in a well known manner by voltage regulator 300. These high programming and erasing voltages typically exceed memory system 10's supply voltage $V_{pp}$ (not shown).

The voltage levels of internal nodes of memory system 10 are influenced by the capacitances of such nodes and by other intrinsic parasitic effects. As a result, the changing potentials on such nodes during transitions between application of read voltages and the much higher programming/erasing voltages, e.g. during voltage transitions on line $V_{pp}$ associated with transitions between read and program or erase operations, may undesirably forward bias P/N junctions within memory system 10. The forward biasing of such P/N junctions may in turn lead to undesirable latch-up conditions. Accordingly, it is necessary to control such voltage transitions occurring between read and program or erase operations in a manner that prevents the undesirable forward biasing of P/N junctions within memory system 10.

The latch-up problems discussed above may be alleviated by providing an NMOS transistor 11 having a large channel width-to-length (W/L) ratio between program line $V_{pp}$ and the supply voltage $V_{DD}$ of memory system 10, as shown in FIG. 2. Although effective in preventing latch-up conditions, the inclusion of transistor 11 within memory system 10 may be problematic. For instance, during those operations of memory system 10 in which oscillator 100 and charge pump 200 are inactive, e.g. during read and erase operations, transistor 11 pulls line $V_{pp}$ to a maximum voltage equal to the supply voltage $V_{DD}$ minus the threshold voltage $V_t$ of transistor 11. As a result, the voltage levels of nodes within memory array 400 and any additional associated logic circuitry that is designed to operate from the supply voltage $V_{DD}$ will in practice be limited to less than a full rail-to-rail voltage swing. In other words, the supply voltage $V_{DD}$ is effectively reduced to $V_{DD}$ minus $V_t$. Since the threshold voltage of a typical NMOS transistor is approximately 1 volt, this reduction in the effective supply voltage $V_{DD}$ becomes significant for low voltage operations. For instance, where the supply voltage $V_{DD}$ is a 2.7 volt supply, the inclusion of transistor 11 in memory system 10, as shown in FIG. 2, forces memory array 400 to operate within approximately a 1.7 volt swing, thereby rendering an efficient operation of memory system 10 impractical.

Moreover, memory system 10 suffers from another serious drawback. At the end of a programming cycle, additional circuitry (not shown) is required to discharge line $V_{pp}$ from a high program voltage to a lower read voltage (typically $V_{DD}$ or lower). This additional circuitry, in addition to consuming valuable silicon real estate, undesirably draws DC current from the supply voltage $V_{DD}$, thereby wasting power.

Thus, it is desirable for a circuit to control the voltages provided to memory cells within a memory array in a manner which allows for voltages greater than the supply voltage to be provided thereto without resulting in latch-up problems and effectively reducing the supply voltage and which does not result require additional circuitry for discharging program line $V_{pp}$.

SUMMARY

In accordance with the present invention, a switching circuit is provided which prevents an unwanted forward biasing of P/N junctions of non-volatile memory elements which may be employed as part of a larger memory array, while allowing voltages exceeding the supply voltage to be provided in a precise manner to such memory elements. The switching circuit effectively isolates programming voltages from supply voltages during programming operations and isolates erasing voltages from supply voltages during erasing operations, thereby allowing programming and erasing voltages which exceed the supply voltage to be provided to the memory array. The switching circuit also prevents the unwanted forward biasing of P/N junctions within the switching circuit and P/N junctions within the associated memory array by controlling the discharging rates of internal nodes when transitioning between either a program or erase operation and a read operation.

DETAILED DESCRIPTION

Figure 3:
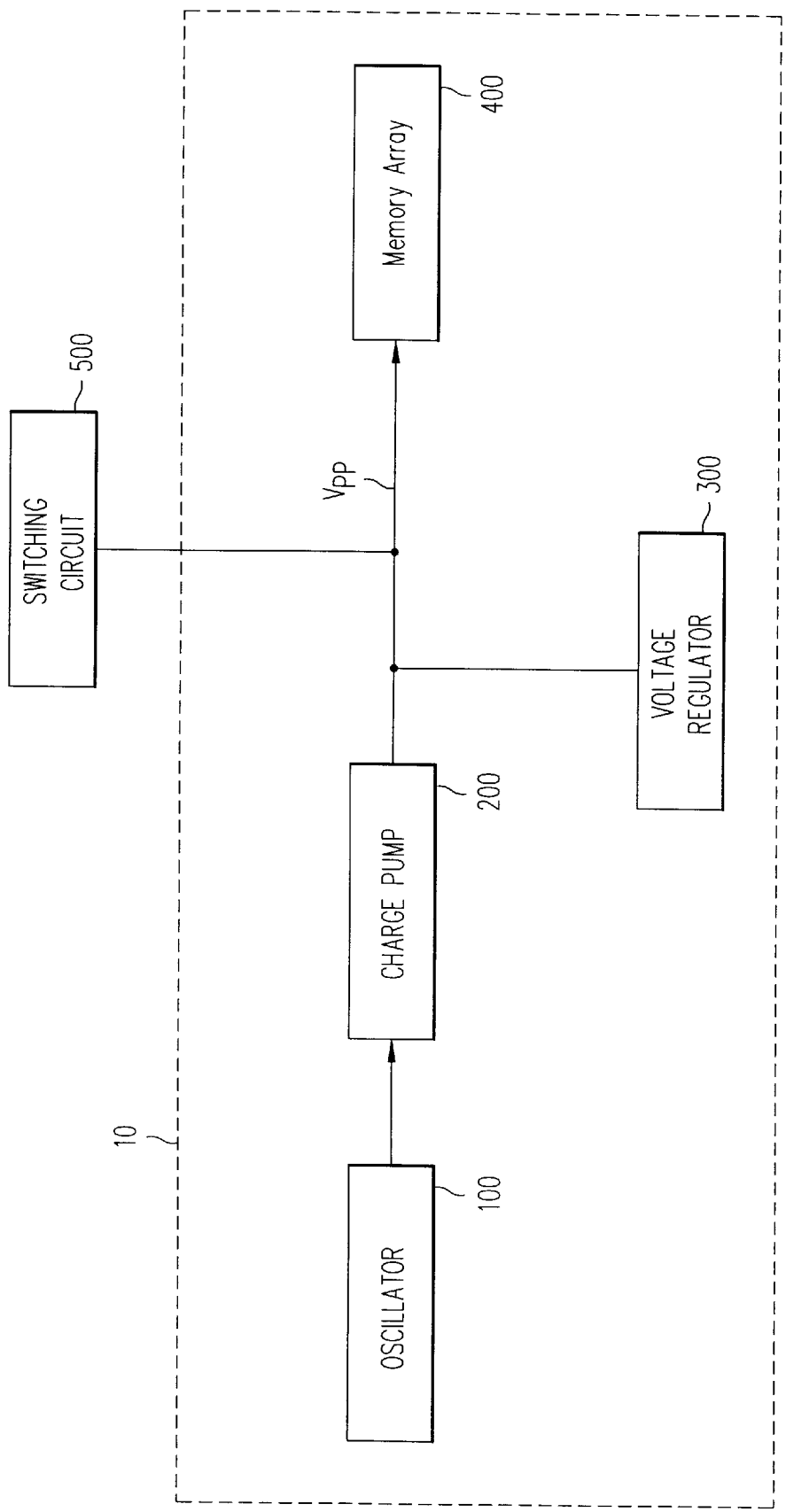
FIG. 3 is a block diagram of a memory system employing a switching circuit 500 in accordance with the present invention.

A switching circuit 500 which prevents an undesirable forward-biasing of P/N junctions within an associated CMOS programmable memory structure is provided. Although the operation of switching circuit 500 is discussed below in the context of memory system 10 as shown in FIG. 3, it is to be understood that switching circuit 500 may be used or easily adapted for use with any suitable memory system employing a variety of different programming and erasing voltages. Further, although intended for use with and discussed below in the context of providing various operating voltages to a non-volatile memory array which employs as memory cells P-channel floating gate transistors, switch 500 may be easily adapted by those skilled in the art after reading this disclosure for use with memory arrays employing, for example, N-channel transistor memory cells, or any other system which requires programming voltages which exceed the supply voltage such as, for instance, fuses and anti-fuses.

Figure 4:
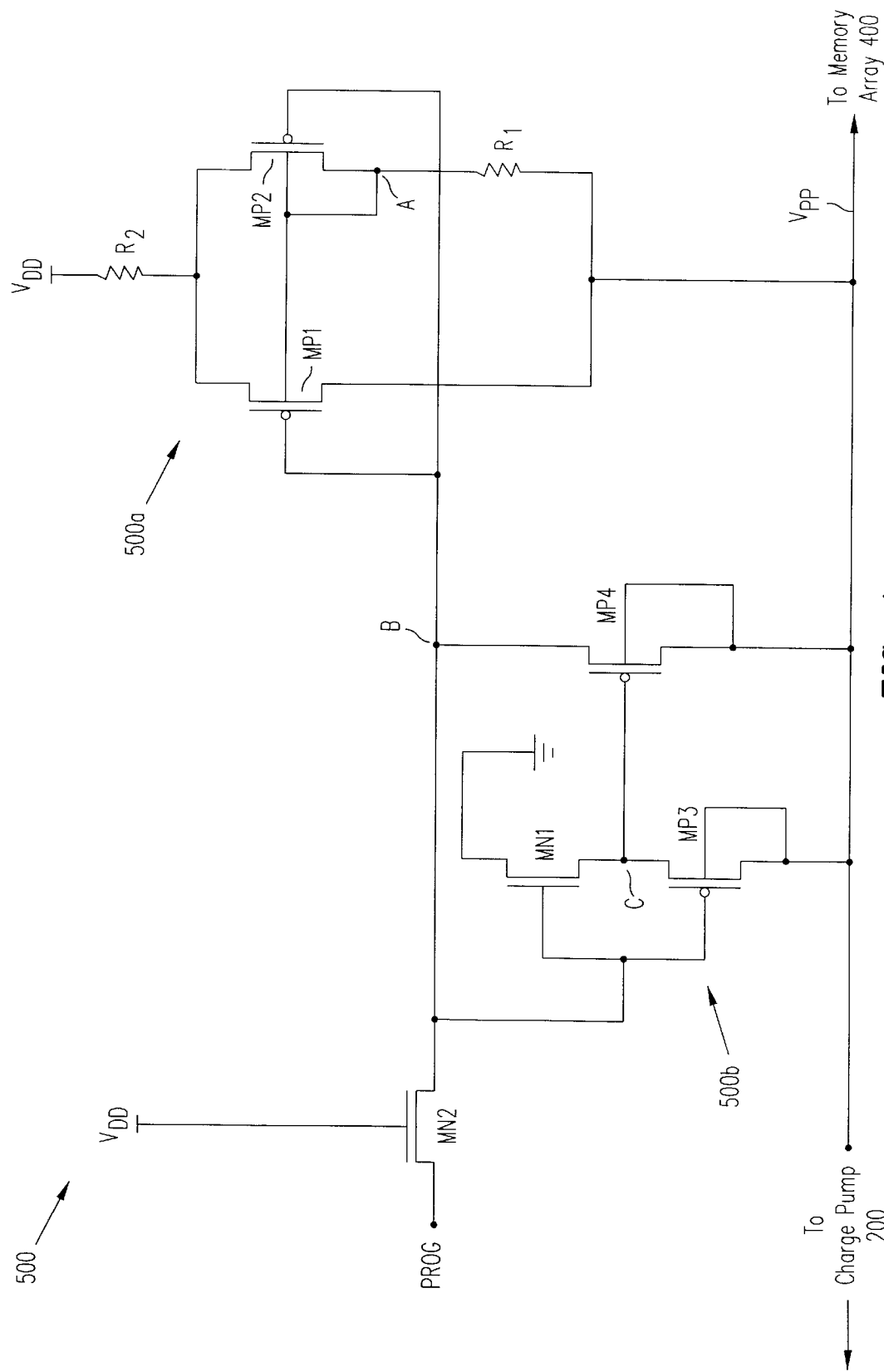
FIG. 4 is a schematic diagram at the transistor level of a switching circuit 500 in accordance with the present invention.

Referring to FIG. 4, switching circuit 500 includes a first stage 500a having two PMOS transistors MP1 and MP2 fabricated in a common N-well. The drain of transistor MP2 (node A) is electrically connected to this N-well. As will be explained below, stage 500a isolates program/erase voltage line $V_{pp}$ from the supply voltage $V_{DD}$ during programming and erasing operations and connects line $V_{pp}$ to the supply voltage $V_{DD}$ during read operations. Although transistors MP1 and MP2 may in other embodiments be formed in different wells, in such other embodiments these wells should all be maintained at the same potential and at the same potential as the drain of transistor MP2. A resistor $R_1$ is connected between node A and line $V_{pp}$. The gates of transistors MP1 and MP2 are coupled to a node B. A resistor $R_2$ is coupled between supply voltage $V_{DD}$ and the commonly coupled sources of transistors MP1 and MP2.

Switching circuit 500 includes a second stage 500b connected between node B and line $V_{pp}$. Operating as a high voltage level shifter, stage 500b includes a CMOS inverter formed by PMOS transistor MP3 and NMOS transistor MN1 series connected between ground and line $V_{pp}$, and also includes a PMOS transistor MP4 connected between node B and line $V_{pp}$. The gate of transistor MP4 is coupled to the output terminal of the inverter formed by transistors MP3 and MN1. A programming signal on line PROG is provided to node B via an NMOS pass transistor MN2, the gate of which is connected to $V_{DD}$.

Referring also to FIG. 3, when it is desired to read selected memory cells (not shown for simplicity) within memory array 400, oscillator 100 and charge pump 200 are inactive, and line PROG is connected to ground potential by conventional means (not shown for simplicity). Since pass transistor MN2 remains in a conductive state (its gate is tied to supply voltage $V_{DD}$), node B discharges to ground potential through transistor MN2. As a result, transistors MP1 and MP2, the gates of which are connected to node B, become conductive and pull line $V_{pp}$ up to $V_{DD}$, thereby providing an appropriate read voltage, i.e. $V_{DD}$, to those selected memory cells within memory array 400.

When it is desired to program selected memory cells within array 400, oscillator 100 and charge pump 200 are operated together in a conventional manner to generate a high programming voltage on line $V_{pp}$. In some embodiments, this high programming voltage is generated by a conventional charge pump circuit and may range from approximately 6 to 15 volts. In other embodiments, the voltage provided on line $V_{pp}$ during programming operations may be ramped from a low potential to a higher potential. Line PROG is connected to a source of a logic high signal which in some embodiments may be $V_{DD}$. This logic high signal on line PROG propagates through pass transistor MN2 and appears at node B, thereby causing transistors MN1 and MP3 to turn on and off respectively, thereby causing the signal at the output terminal of the inverter formed by transistors MP3 and MN1 (node C) to transition to a logic low state. In response thereto, transistor MP4 turns on and provides a low impedance path between node B and line $V_{pp}$ and thus pulls up node B to the high programming voltage on line $V_{pp}$. The increased potential on node B turns off transistors MP1 and MP2, thereby effectively isolating line $V_{pp}$ from the supply voltage $V_{DD}$. As a result, charge pump 200 may increase the voltage on line $V_{pp}$ to levels exceeding that of the supply voltage $V_{DD}$, thereby allowing for high voltages to be provided to memory array 400 for programming operations. Otherwise, the voltage on line $V_{pp}$ would be limited to the supply voltage $V_{DD}$ which may not be sufficient to program and erase memory cells within array 400.

Figure 5:
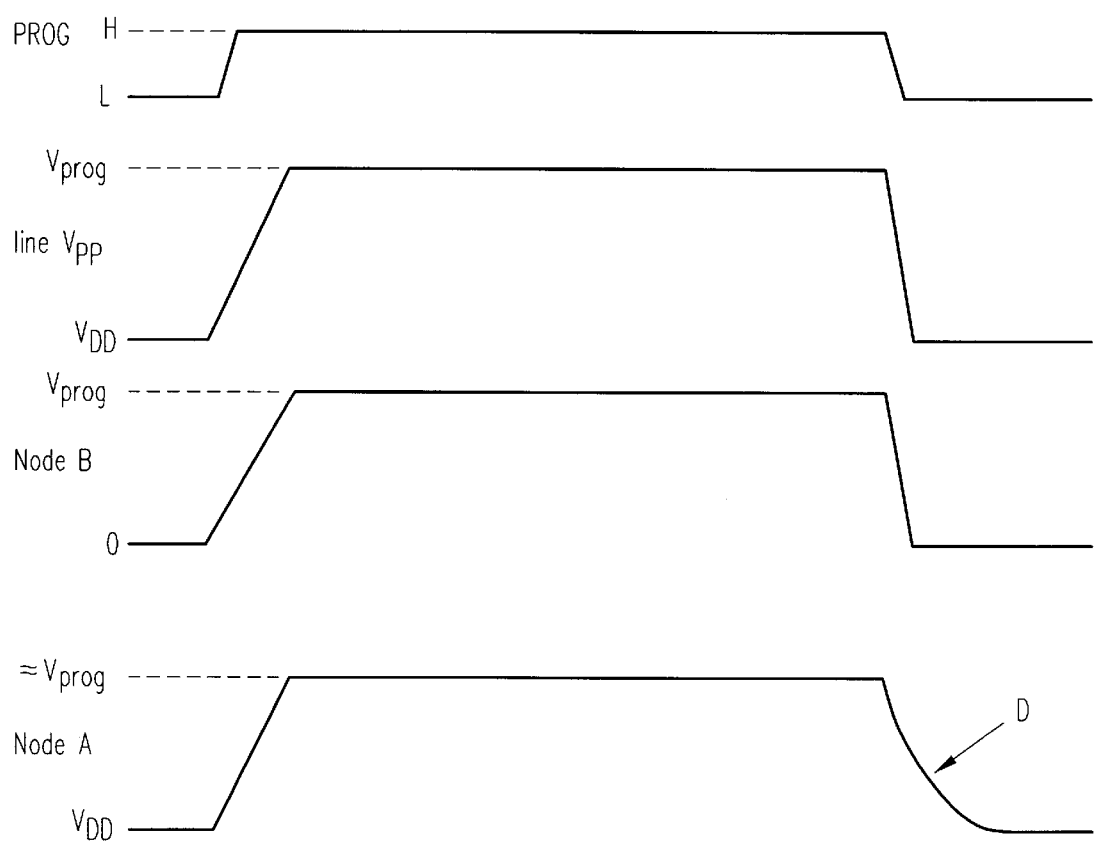
FIG. 5 is a timing diagram of various nodes within switching circuit 500 during operation of switching circuit 500.

The timing diagram of FIG. 5 illustrates the above-described operation of switching circuit 500. Thus, the transitioning of signal PROG from a logic low state L to a logic high state H causes transistor MP4 to electrically connect node B to the programming voltage $V_{prog}$ on line $V_{pp}$, thereby resulting in node B "following" the programming voltage $V_{prog}$. The potential of node A during programming, as described above, is approximately equal to the programming voltage $V_{prog}$ on line $V_{pp}$ plus the voltage drop across resistor $R_1$. The discharging of node A is indicated in FIG. 5 by arrow D.

After programming memory array 400, the line PROG is returned to ground potential, thereby discharging node B to ground potential via pass transistor MN2. As the potential on node B falls to ground, the inverter formed by transistors MP3 and MN1 provides a logic high signal to the gate of transistor MP4 so as to turn off transistor MP4 and thereby isolate line $V_{pp}$ from node B. The discharging of node B also turns on PMOS transistors MP1 and MP2. Line $V_{pp}$ discharges until the potential of line $V_{pp}$ equals that of supply voltage $V_{DD}$, where the conductive states of transistors MP1 and MP2 maintain the potential of line $V_{pp}$ approximately equal to that of the supply voltage $V_{DD}$.

The rate of discharging of line $V_{pp}$ at the end of programming operations must be controlled in order to avoid overshoot problems. Otherwise, the potential on line $V_{pp}$ may fall below that of the supply voltage $V_{DD}$. This overshoot condition, if allowed to propagate to the N-well(s) within which transistors MP1 and MP2 are formed, may undesirably forward bias the source-to-well and/or drain-to-well P/N junctions of transistors MP1 and MP2 and thereby result in an undesirable latch-up condition.

Switching circuit 500 prevents this undesirable latch-up condition by limiting the rate of discharge of node A. The channel width-to-length (W/L) ratio of transistor MP2 is much smaller than the W/L ratio of transistor MP1. For instance, in some embodiments, the W/L ratios of transistors MP1 and MP2 are between approximately 10 and 25 and between approximately 0.1 and 0.5, respectively, although other ratios may be employed without departing from the scope of the present invention. The smaller W/L ratio of transistor MP2, as compared to that of transistor MP1, ensures that current flow through transistor MP2 is much smaller than the current flow through transistor MP1, thereby limiting the rate of discharge of node A.

As mentioned above, the well(s) within which transistors MP1 and MP2 are formed and the drain of transistor MP2 are electrically coupled together. Accordingly, the capacitance of node A is influenced by the capacitance $C_1$ of such wells. As a result, the capacitance $C_1$ of such well(s) slows the rate of discharge of node A, where the discharge rate of node A may be expressed as follows:

$$V_A(t) = V_{pp} e^{-t/RC_s}$$

where $V_{pp}$ is the programming voltage, R is the equivalent discharge resistance of node A, $C_s$ is the effective storage capacitance of node A (which is approximately equal to the capacitance $C_1$ of the well within which transistors MP1 and MP2 are formed), and t is time.

Resistor $R_1$ also limits node A rapidly discharging. Applicant has determined that resistor $R_1$ should be in the range of approximately 1–20 kΩ to provide optimum performance. Higher resistance values for resistor $R_1$ may unduly slow the speed with which memory cells within memory array 400 may be programmed, while lower resistance values for resistor $R_1$ may not sufficiently limit the discharge rate of node A to prevent latch-up problems.

As a result, node A necessarily discharges more slowly than line $V_{pp}$ and, therefore, node A and the well within which transistors MP1 and MP2 are formed will always be at a potential higher than that of line $V_{pp}$. In this manner, the source-to-well and/or drain-to-well P/N junctions of transistors MP1 and MP2 are prevented from becoming forward biased.

Further, assuming that the well or wells within which are formed the transistors of the decode circuitry (not shown) associated with memory array 400 are maintained at the same potential as the well(s) within which transistors MP1 and MP2 are formed, the well or wells within which the transistors of the decode circuitry are formed cannot fall below the potential of the P+ source and drain regions of the transistors formed therein. In this manner, latch-up problems resulting from switching voltages on line $V_{pp}$ may also be virtually eliminated within memory system 10 that includes switching circuit 500.

Resistor $R_2$ and the respective source-to-well capacitances of transistors MP1 and MP2 form a filter that filters out the high frequency components of noise present on $V_{DD}$. Thus, any variations in $V_{DD}$ are effectively transmitted to node A via resistor $R_2$, transistor MP1, and resistor $R_1$ and via resistor $R_2$ and transistor MP2. In this manner, resistor $R_2$ minimizes latch-up susceptibility resulting from glitches in the $V_{DD}$. In preferred embodiments, resistor $R_2$ is of a value between approximately 100 and 500 Ω. Although higher values of resistor $R_2$ may be employed, such higher resistances may create a undesirably large voltage drop between $V_{DD}$ and line $V_{pp}$ during, for instance, read operations, thereby undesirably limiting the voltage levels on line $V_{pp}$. In other embodiments, resistor $R_2$ may be altogether eliminated. Although increasing latch-up susceptibility, the elimination of resister $R_2$ may result in savings in die area.

Figure 1:
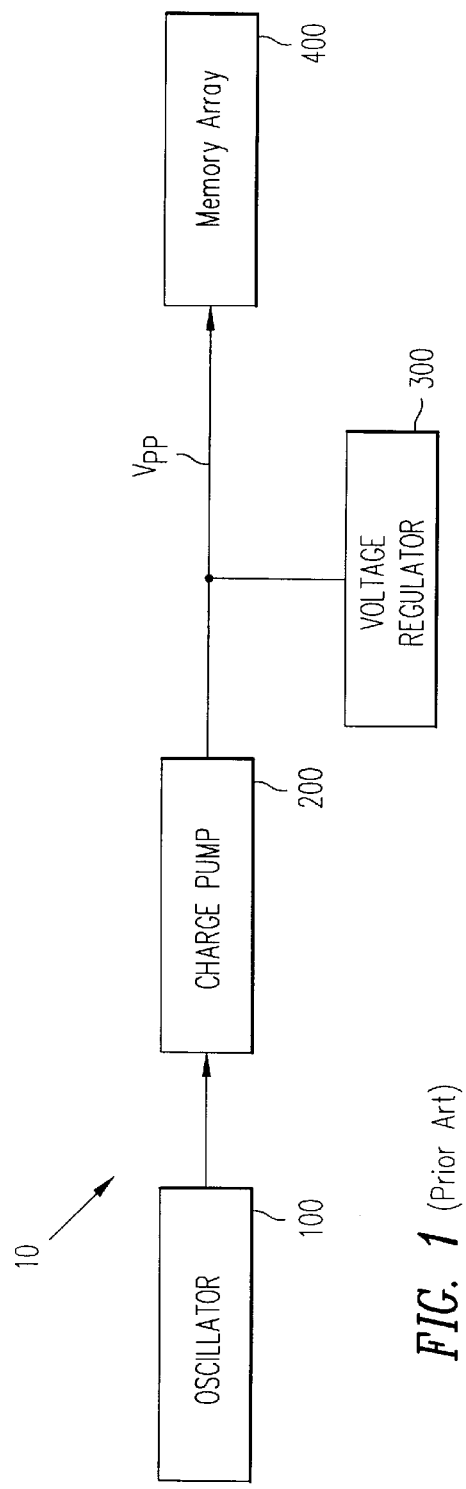
FIG. 1 and 2 are block diagrams of conventional memory systems.
Figure 2:
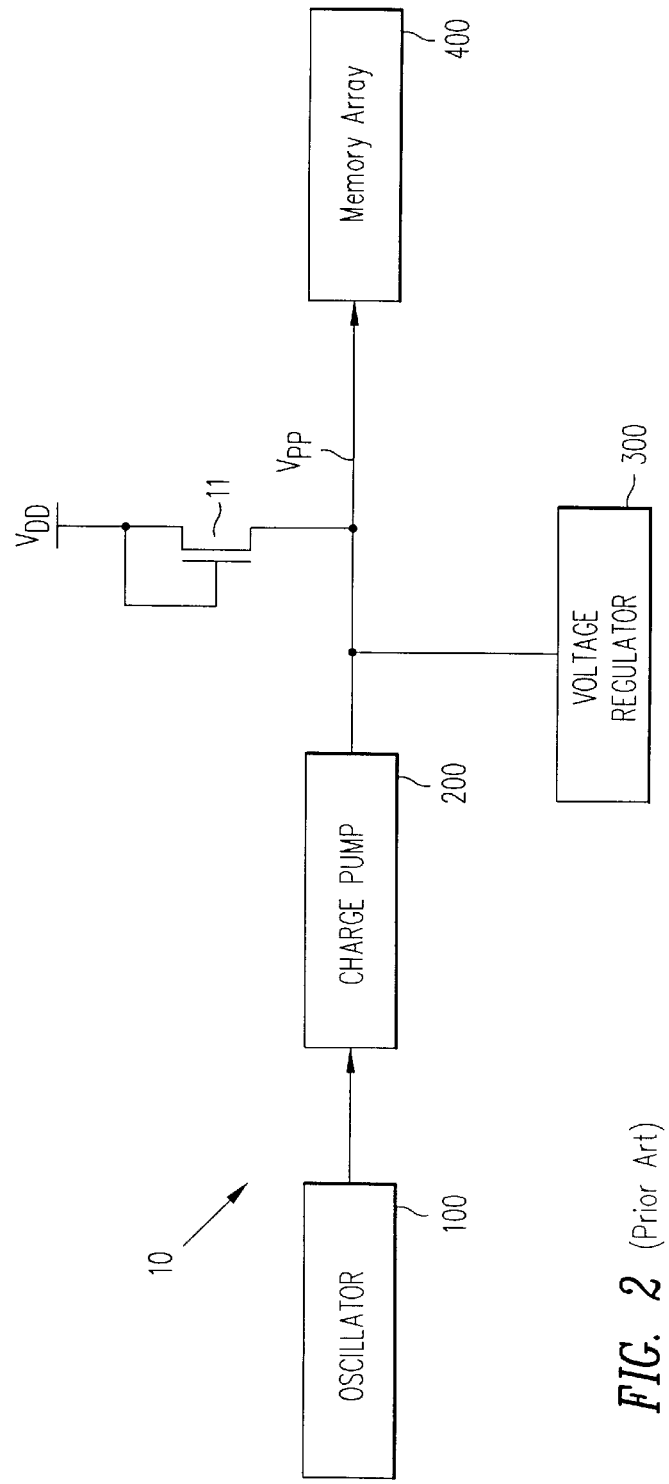

The above-described embodiment allows an associated memory array 400 to operate with a full rail-to-rail voltage swing. This is in contrast to memory systems which, for instance, employ a transistor as a switching circuit (e.g., see FIG. 2). The ability to achieve a full rail-to-rail swing becomes more important as supply voltages become smaller. Thus, although switching circuit 500 may be used in conjunction with any supply voltage, the advantages of switching circuit 500 are more pronounced when using smaller supply voltages.

The operation of switching circuit 500 where it is desired to erase selected cells of associated memory array 400 is identical to that described above with respect to the program operation and will thus not be discussed herein.

While particular embodiments of the present invention have been shown and described, it will be apparent to those skilled in the art that changes and modifications may be made without departing from this invention in its broader aspects and, therefore, the appended claims are to encompass within their scope all such changes and modifications as fall within the true spirit and scope of this invention. For example, it is to be understood that the polarities of the above described transistors may be reversed without departing from the scope of the appended claims.

What is claimed is:

1. A switching circuit for providing selected voltages to an associated memory array using a program voltage line, said switching circuit comprising:
   an input node for receiving a control signal, said control signal comprising two logic levels; and
   a first stage connected between a source of supply voltage and said program voltage line, said first stage isolating said program voltage line from said source of supply voltage in response to said control signal indicating a program operation and electrically connecting said program voltage line to said source of supply voltage in response to said control signal indicating a read operation.

2. The switching circuit of claim 1, further comprising a second stage connected between said input node and said program voltage line, said second stage pulling said input node up to the voltage on said program voltage line in response to said control signal indicating said program operation and isolating said program voltage line from said input node in response to said control signal indicating said read operation.

3. The switching circuit of claim 1, wherein said first stage comprises:
   a first transistor having a source, a gate coupled to receive said control signal, and a drain coupled to said program voltage line;
   a second transistor having a gate coupled to said gate of said first transistor, a source coupled to said source of said first transistor, and a drain;
   first means coupling said sources of said first and second transistors to said source of voltage supply; and
   second means coupling said drain of said second transistor to said program voltage line.

4. The switching circuit of claim 3, wherein said first means comprises an impedance element.

5. The switching circuit of claim 3, wherein said second means comprises an impedance element.

6. The switching circuit of claim 3, wherein said first and second transistors comprise PMOS transistors.

7. The switching circuit of claim 3, wherein said first and second transistors are formed in an N-well, said N-well being electrically connected to said drain of said second transistor.

8. The switching circuit of claim 2, wherein said second stage comprises:
   an inverter having an input terminal coupled to said input node and having an output terminal; and
   a third transistor coupled between said program voltage line and said input node and having a gate coupled to said output terminal of said inverter.

9. The switching circuit of claim 8, wherein said inverter comprises:
   a fourth transistor having a source coupled to ground, a gate coupled to said input node, and a drain; and
   a fifth transistor having a source coupled to said program voltage line, a gate coupled to said input node, and a drain coupled to said drain of said fourth transistor.

10. The switching circuit of claim 8, wherein said second stage further comprises a sixth transistor having a source coupled to said input node, a gate coupled to said source of supply voltage, and a drain coupled to a control terminal, said sixth transistor providing said control signal to said input node.

11. A switching circuit for providing high program and erase voltage levels and a low read voltage level to an associated memory array, said switching circuit operating between a source of supply voltage and a program voltage line, said switching circuit comprising:

an input node for receiving a control signal having at least a first state and a second state; and switching means coupled between said program voltage line and said source of supply voltage, said switching means disconnecting said program voltage line from said source of supply voltage in response to said control signal being in said first state and thereby isolating said program voltage line from said supply voltage during program and erase operations, said switching means pulling up said program voltage line to said source of supply voltage in response to said control signal being in said second state and thereby electrically connecting said program voltage line to said source of supply voltage during read operations.

12. The switching circuit of claim 11, further comprising a voltage level shifter coupled between said input node and said program voltage line, said voltage level shifter connecting said input node to said program voltage line in response to said control signal being in said first state and thereby increasing the potential on said input node, said voltage level shifter disconnecting said input node from said program voltage line in response to said control signal being in said second state and thereby allowing the voltage on said input node to discharge to a lower voltage.

13. A switching circuit for providing selected voltages to an associated memory array using a program voltage line, said switching circuit comprising:

an input node for receiving a control signal;

a first transistor having a source, a gate coupled to receive said control signal, and a drain coupled to said program voltage line;

a second transistor having a gate coupled to said gate of said first transistor, a source coupled to said source of said first transistor, and a drain;

first means coupling said sources of said first and second transistors to a voltage supply; and second means coupling said drain of said second transistor to said program voltage line.

14. The switching circuit of claim 13, further comprising:

an inverter having an input terminal coupled to said input node and having an output terminal; and a third transistor coupled between said program voltage line and said input node and having a gate coupled to said output terminal of said inverter.

15. A method for providing during program and read operations selected voltages to an associated memory array using a voltage line controlled by a switching circuit, said memory array and said switching circuit operating from a voltage supply, said method comprising the steps of:

electrically connecting said voltage line to said voltage supply in response to a logic control signal indicating read operations so that the voltage of said voltage supply is provided to said associated memory array as a read voltage; and electrically isolating said voltage line from said voltage supply in response to said logic control signal indicating program operations so that the voltage of said voltage line may be raised to a potential greater than the potential of said voltage supply.

* * * * *

UNITED STATES PATENT AND TRADEMARK OFFICE
CERTIFICATE OF CORRECTION

PATENT NO.    :    5,774,406
DATED         :    June 30, 1998
INVENTOR(S)   :    Vikram Kowshik It is certified that error appears in the above-identified patent and that said Letters Patent is hereby corrected as shown below:

On the title page: Item [73]

Assignee: Programmable Microelectronics Corporation, San Jose, Calif.

Signed and Sealed this

Thirteenth Day of October 1998

*Attest:*

BRUCE LEHMAN

*Attesting Officer*     Commissioner of Patents and Trademarks